US012765334B2

(12) United States Patent
Kato et al.

(10) Patent No.: US 12,765,334 B2
(45) Date of Patent: Oct. 13, 2026

(54) BONDED OBJECT PRODUCTION METHOD USING A CONTINUOUS FURNACE TO PROCESS A STACKED BODY AND PRODUCTION METHOD FOR CERAMIC CIRCUIT SUBSTRATE USING SAME

(71) Applicant: Niterra Materials Co., Ltd., Kanagawa (JP)

(72) Inventors: Hiromasa Kato, Nagareyama (JP); Masanori Hoshino, Yokohama (JP); Hideaki Hirabayashi, Yokohama (JP); Seiichi Suenaga, Yokohama (JP); Kazumitsu Morimoto, Yokohama (JP)

(73) Assignee: Niterra Materials Co., Ltd., Kanagawa (JP)

( * ) Notice: Subject to any disclaimer, the term of this patent is extended or adjusted under 35 U.S.C. 154(b) by 330 days.

(21) Appl. No.: 18/508,284

(22) Filed: Nov. 14, 2023

(65) Prior Publication Data

US 2024/0079238 A1 Mar. 7, 2024

Related U.S. Application Data

(63) Continuation of application No. PCT/JP2022/020521, filed on May 17, 2022.

(30) Foreign Application Priority Data

May 19, 2021 (JP) ................................ 2021-084320

(51) Int. Cl.
*H10P 90/00* (2026.01)
*H10D 48/07* (2025.01)
(Continued)

(52) U.S. Cl.
CPC ....... *H10P 90/1914* (2026.01); *H10D 48/074* (2025.01); *H10P 14/69433* (2026.01); *H10W 99/00* (2026.01)

(58) Field of Classification Search
CPC .......... H10P 90/1914; H10P 14/69433; H10P 90/00; H10D 48/074; H10W 99/00;
(Continued)

(56) References Cited

U.S. PATENT DOCUMENTS 4,471,026 A 9/1984 Nicholas et al.
4,483,810 A 11/1984 Bunk et al.
(Continued)

FOREIGN PATENT DOCUMENTS

CN 104517865 A 4/2015
CN 109417056 A 3/2018
(Continued)

OTHER PUBLICATIONS

Extended European Search Report Issued May 23, 2025 in European Patent Application No. 22804680.1, 9 pages.
(Continued)

*Primary Examiner* — Caleb E Henry
(74) *Attorney, Agent, or Firm* — Oblon, McClelland, Maier & Neustadt, L.L.P.

(57) ABSTRACT

A bonded object production method according to an embodiment uses a continuous furnace to process a stacked body including a metal member, a ceramic member, and a brazing material layer located therebetween, while conveying the stacked body; and the method includes a process of heating the stacked body in an inert atmosphere from 200° C. to a bonding temperature at an average temperature raising rate of the stacked body of not less than 15° C./min, a process of bonding the stacked body in an inert atmosphere at the bonding temperature that is within a range of not less than 600° C. and not more than 950° C., and a process of cooling the stacked body from the bonding temperature to 200° C.
(Continued)

at an average temperature lowering rate of the stacked body of not less than 15° C./min. A ceramic substrate is favorably a silicon nitride substrate.

19 Claims, 2 Drawing Sheets

(51) Int. Cl.
*H10P 14/694* (2026.01)
*H10W 99/00* (2026.01)

(58) Field of Classification Search
CPC ............. H10W 40/255; B23K 35/0233; B23K 35/302; B23K 1/00; B23K 1/0016; B23K 1/008; B23K 1/19; B32B 2457/00; B32B 9/005; B32B 15/04; B32B 15/20; C04B 2235/6562; C04B 2235/6565; C04B 2235/725; C04B 2235/786; C04B 2235/96; C04B 2237/124; C04B 2237/127; C04B 2237/343; C04B 2237/366; C04B 2237/368; C04B 2237/407; C04B 2237/704; C04B 2237/706; C04B 2237/708; C04B 37/026; H01L 23/3735; H01L 21/4807; H01L 21/02002; H05K 1/0306; H05K 3/022; H05K 3/38
See application file for complete search history.

(56) References Cited

U.S. PATENT DOCUMENTS

| | | | | | |
|---|---|---|---|---|---|
| 4,591,401 | A * | 5/1986 | Neidig | H05K 3/385 228/195 |
| 9,833,855 | B2 * | 12/2017 | Terasaki | B23K 35/3611 |
| 10,199,237 | B2 * | 2/2019 | Terasaki | C04B 37/026 |
| 11,062,974 | B2 * | 7/2021 | Terasaki | H01L 21/4882 |
| 11,476,127 | B2 * | 10/2022 | Oohiraki | H01L 21/4867 |
| 2003/0222126 | A1 * | 12/2003 | Morozumi | B23K 1/0016 228/245 |
| 2004/0074951 | A1 * | 4/2004 | Takahashi | B32B 15/20 257/E23.106 |
| 2012/0168209 | A1 | 7/2012 | Kato | |
| 2014/0291699 | A1 * | 10/2014 | Yano | C04B 37/026 257/77 |
| 2015/0257252 | A1 * | 9/2015 | Kato | H05K 1/0207 174/268 |
| 2016/0013073 | A1 * | 1/2016 | Terasaki | C04B 37/026 156/89.18 |
| 2018/0005918 | A1 * | 1/2018 | Naba | H10W 40/255 |
| 2018/0019182 | A1 * | 1/2018 | Kato | H10W 40/255 |
| 2020/0128664 | A1 | 4/2020 | Harada et al. | |
| 2020/0170118 | A1 | 5/2020 | Kato et al. | |
| 2020/0309454 | A1 * | 10/2020 | Kamei | F27B 9/045 |
| 2024/0079238 | A1 * | 3/2024 | Kato | H05K 3/022 |
| 2025/0069994 | A1 * | 2/2025 | Sasaki | H01L 23/49506 |
| 2025/0087576 | A1 * | 3/2025 | Fujisawa | H01L 23/49861 |

FOREIGN PATENT DOCUMENTS

| | | | |
|---|---|---|---|
| CN | 110537256 | A | 12/2019 |
| CN | 110999553 | A | 4/2020 |
| EP | 0 085 914 | A2 | 8/1983 |
| EP | 3 618 107 | A1 | 3/2020 |
| JP | 56-93845 | A | 7/1981 |
| JP | 3-290378 | A | 12/1991 |
| JP | 5-32463 | A | 2/1993 |
| JP | 7-187839 | A | 7/1995 |
| JP | 11-157952 | A | 6/1999 |
| JP | 2000-226274 | A | 8/2000 |
| JP | 2002-274964 | A | 9/2002 |
| JP | 2003-055058 | A | 2/2003 |
| JP | 2003-283064 | A | 10/2003 |
| JP | WO2018/199060 | A1 | 11/2018 |
| JP | 6789955 | B2 | 11/2020 |
| KR | 2003-0053245 | A | 6/2003 |

OTHER PUBLICATIONS

Combined Chinese Office Action & Search Report issued May 14, 2025 in Chinese Patent Application No. 202280035521.3, (with unedited computer-generated English translation), 16 pages.
International Search Report issued Jul. 12, 2022 in PCT/JP2022/020521 filed on May 17, 2022, 3 pages.
Chinese Notice of Allowance dated May 11, 2026, issued in Chinese Patent Application No. 202280035521.3 (with English translation; Documents 18-20 being cited therein).

* cited by examiner

BONDED OBJECT PRODUCTION METHOD USING A CONTINUOUS FURNACE TO PROCESS A STACKED BODY AND PRODUCTION METHOD FOR CERAMIC CIRCUIT SUBSTRATE USING SAME

CROSS-REFERENCE TO RELATED APPLICATIONS

This is a continuation application of International Patent Application No. PCT/JP2022/020521, filed on May 17, 2022; and also claims priority to Japanese Patent Application No. 2021-084320, filed on May 19, 2021; the entire contents of which are incorporated herein by reference.

FIELD

Embodiments described below generally relate to a bonded object production method and a production method for a ceramic circuit substrate using the same.

BACKGROUND

Ceramic circuit substrates are included in circuit substrates on which semiconductor elements are mounted. For example, Japanese Patent No. 6789955 (Patent Literature 1) discusses a ceramic circuit substrate in which the size of the bonding layer jutting portion is controlled. The ceramic circuit substrate of Patent Literature 1 has excellent temperature cycle test (TCT) characteristics.

In a ceramic circuit substrate, a ceramic substrate and a copper plate are bonded via a brazing material layer. The brazing material layer includes an active metal brazing material including Ti. The bonding technique that uses the active metal brazing material is called active metal bonding. Active metal bonding is performed at 700 to 900° C. The heating process is performed in a vacuum. The reaction between Ti and the ceramic substrate in the brazing material is promoted by bonding in a vacuum. For example, when a silicon nitride substrate is used, Ti and nitrogen react to form a titanium nitride layer. The silicon nitride substrate and the copper plate are securely bonded by the formation of the titanium nitride layer.

Conventionally, a batch furnace is used to bond in a vacuum. A vacuum can be pulled in the batch furnace by setting the interior of the furnace to an airtight state. An evacuation process is necessary to pull a vacuum. Because it is necessary to make the temperature rise uniform inside the furnace, the temperature raising rate is about 1 to 2° C./min. Therefore, it takes much time until the batch furnace can be maintained at the heating temperature. It also takes much time to lower the temperature from the bonding temperature to room temperature. In a batch furnace, the bonded object cannot be extracted before reaching room temperature. Forced cooling to return to room temperature could cause damage of the batch furnace. Also, the amount that can be processed at one time is determined by the size of the furnace. That is, it cannot be said that active metal bonding that uses a batch furnace has excellent suitability for mass production.

To improve the suitability for mass production, active metal bonding is performed in a continuous furnace. For example, JP-A H7-187839 (Kokai) (Patent Literature 2) discusses bonding in a nitrogen atmosphere using a continuous furnace. An evacuation process is unnecessary because the bonding can be performed in a nitrogen atmosphere. In a continuous furnace, thermal bonding can be performed while conveying with a belt conveyor, etc.

DETAILED DESCRIPTION

A bonded object production method according to an embodiment is a bonded object production method using a continuous furnace to process a stacked body while conveying the stacked body; the stacked body includes a metal member, a ceramic member, and a brazing material layer located between the metal member and the ceramic member; and the bonded object production method includes a process of heating the stacked body in an inert atmosphere from 200° C. to a bonding temperature at an average temperature raising rate of the stacked body of not less than 15° C./min, a process of bonding the stacked body in an inert atmosphere at the bonding temperature that is within a range of not less than 600° C. and not more than 950° C., and a process of cooling the stacked body from the bonding temperature to 200° C. at an average temperature lowering rate of the stacked body of not less than 15° C./min.

A continuous furnace is a furnace in which the product to be heated is heated while being conveyed. Continuous furnaces are classified by the transport technique into belt conveyor-type, walking-beam-type, pusher-type, roller hearth-type, etc. A belt conveyor, transfer tray, or the like is used to convey the product to be heated. The furnace may be called a tunnel furnace when the heat treatment region inside the furnace is surrounded in a tunnel shape. Tunnel furnaces are one type of continuous furnace. Continuous furnaces have excellent suitability for mass production because the product to be heated can be heated while being conveyed.

Figure 1:
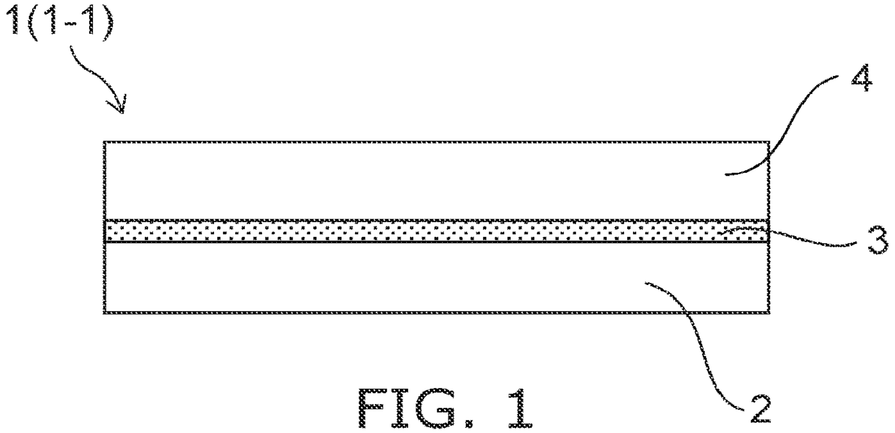
FIG. 1 shows an example of a bonded object according to an embodiment.
Figure 2:
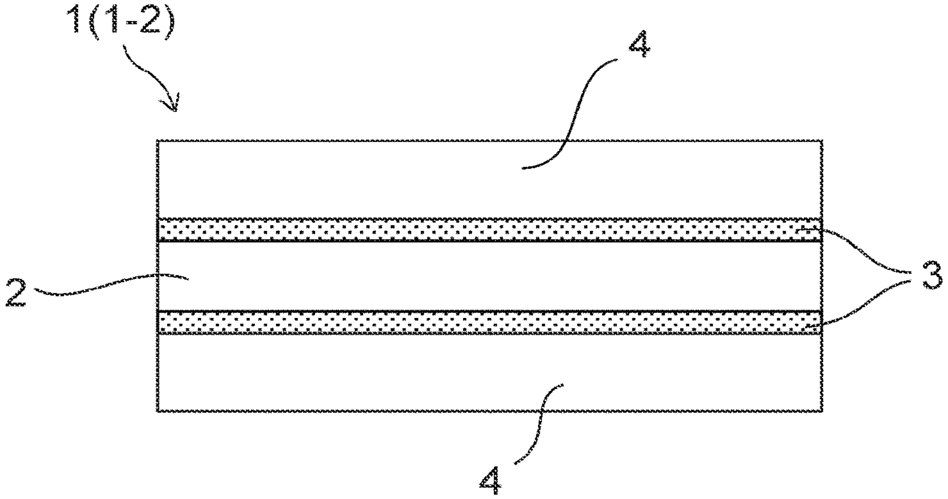
FIG. 2 shows another example of the bonded object according to the embodiment.

The product to be heated that is conveyed is a stacked body having a stacked structure of not less than three layers of a metal member, a brazing material layer, and a ceramic member. The stacked body is thermally bonded to become a bonded object. FIGS. 1 and 2 show examples of bonded objects. In FIGS. 1 and 2, 1 is a bonded object, 2 is a ceramic substrate, 3 is a brazing material layer, and 4 is a metal plate. Also, a bonded object in which the metal plate 4 is bonded only to one surface of the ceramic substrate 2 is called 1-1. A bonded object in which the metal plates 4 are bonded to two surfaces of the ceramic substrate is called 1-2. In the bonded object 1-2, each of a pair of metal plates 4 is bonded to the ceramic substrate 2 via the brazing material layer 3. The ceramic substrate 2 is positioned between the pair of metal plates 4.

Figure 3:
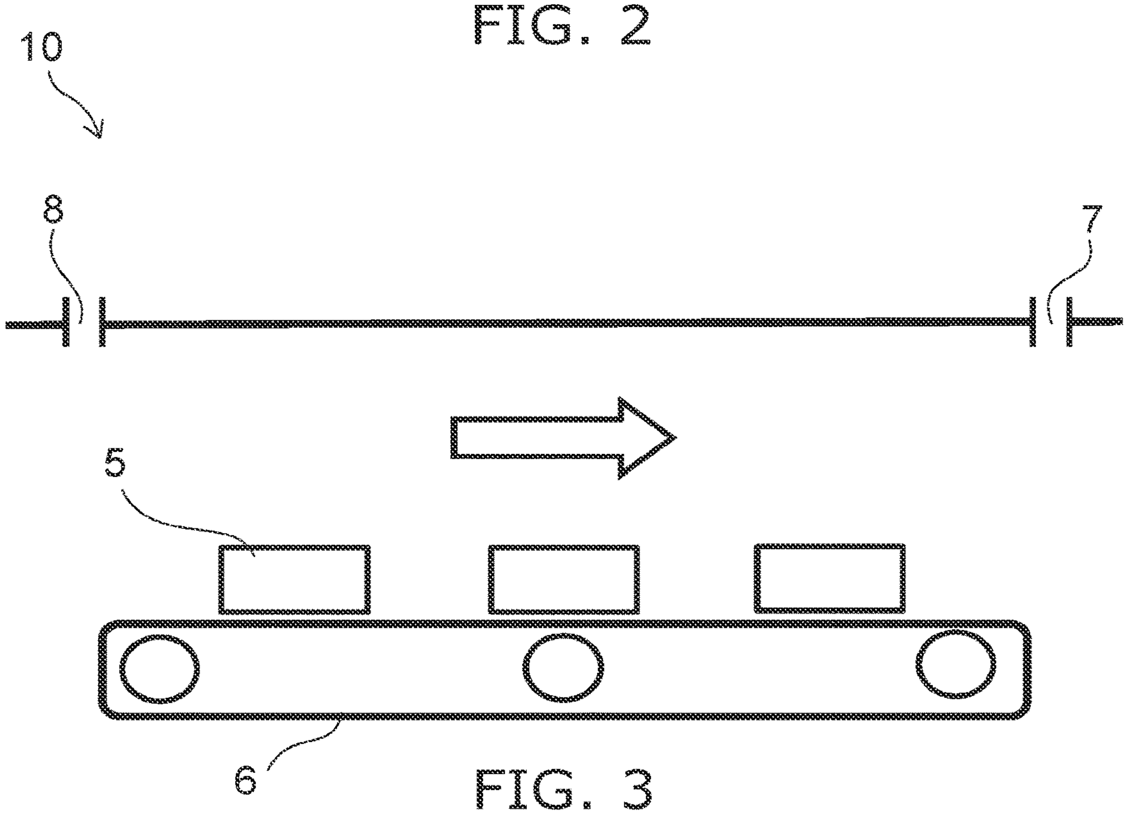
FIG. 3 shows an example of the bonded object production method according to the embodiment that uses a continuous furnace.

FIG. 3 shows an example of the bonded object production method according to the embodiment that uses a continuous furnace. In FIG. 3, 5 is a stacked body, 6 is a belt conveyor, 7 is a supply pipe, 8 is an exhaust pipe, and 10 is a continuous furnace. FIG. 3 illustrates a belt conveyor-type continuous furnace. The structure of the continuous furnace is not limited to the example. Also, the conveyance direction of the stacked body is set to a direction from left to right for convenience, but is not limited thereto.

FIGS. 1 to 3 illustrate a metal plate as the metal member and a ceramic substrate as the ceramic member. The configuration of the bonded object according to the embodiment is not limited to the example. Either or both of the metal member and the ceramic member may have an uneven shape instead of a plate shape.

Embodiments described below refer to an example in which the metal member is a metal plate, and the ceramic member is a ceramic substrate. When the metal member and the ceramic member have shapes other than flat-plate, the metal plate in the description below can be replaced with a metal member, and the ceramic substrate can be replaced with a ceramic member.

The stacked body for making the bonded object 1-1 has a three-layer structure of the metal plate 4, the brazing material layer 3, and the ceramic substrate 2. The stacked body for making the bonded object 1-2 has a five-layer structure of the metal plate 4, the brazing material layer 3, the ceramic substrate 2, the brazing material layer 3, and the metal plate 4. The stacked body may have a seven-layer structure such as the metal plate 4, the brazing material layer 3, the ceramic substrate 2, the brazing material layer 3, the metal plate 4, the brazing material layer 3, and the ceramic substrate 2. Also, the number of stacks may be increased as necessary.

In a production method using a continuous furnace, the stacked body is heated while being conveyed. The conveyance speed of the stacked body may be constant or may be changed partway. Also, the conveyance of the stacked body may be stopped partway through as necessary. Also, the conveyance path may be straight or may be bent. Also, the conveyance path may be flat or may be a sloped path (uphill or downhill). It is favorable for the conveyance path to be straight and flat. When straight and flat, shifting of the stacked structure of the stacked body can be suppressed.

The production method that uses the continuous furnace includes the three processes of a temperature raising process, a thermal bonding process, and a temperature lowering process. The temperature raising process is a process of raising the temperature of the stacked body to the bonding temperature. The thermal bonding process is a process of maintaining the stacked body at the bonding temperature. The temperature lowering process is a process of lowering the temperature of the stacked body from the bonding temperature.

The temperature raising process is a process of heating the stacked body from 200° C. to the bonding temperature. In the temperature raising process, the average temperature raising rate of the stacked body is not less than 15° C./min. The average value of the temperature raising rate of the stacked body from 200° C. to the bonding temperature is the average temperature raising rate. By setting a fast average temperature raising rate of not less than 15° C./min, the temperature rise time can be shortened. Also, the temperature raising rate may be constant or may be changed partway. Also, the temperature raising process may be performed in an inert atmosphere.

In a batch furnace, the process of pulling a vacuum takes time. Also, in a batch furnace, the temperature raising rate is about 1 to 3° C./min because the temperature is raised after placing the stacked body in an airtight space. Therefore, it cannot be said that the suitability for mass production is excellent. Also, the time to pull a vacuum lengthens as the airtight space of the batch furnace is enlarged. In this respect as well, the improvement of the suitability for mass production has been limited in methods using batch furnaces.

The time of the temperature raising process can be reduced by setting the average temperature raising rate of the stacked body from 200° C. to the bonding temperature to be not less than 15° C./min. Also, by performing in an inert atmosphere, an evacuation process is unnecessary. In this respect as well, the time can be reduced.

The effect of the time reduction is insufficient when the average temperature raising rate is less than 15° C./min. Also, the conveyance distance lengthens when the temperature raising rate is low while conveying the stacked body. A long conveyance distance may result in a larger apparatus. Therefore, an average temperature raising rate of not less than 15° C./min is effective. Although not particularly limited, it is favorable for the upper limit of the average temperature raising rate to be not more than 100° C./min. When the average temperature raising rate is greater than 100° C./min, there is a possibility that the heat transferred to the stacked body may fluctuate. Fluctuation in the heat transferred to the stacked body causes fluctuation in the bondability. Fluctuation of the bondability may cause discrepancies of the bonding strength, warp, etc. It is therefore favorable for the average temperature raising rate to be within the range of not less than 15° C./min and not more than 100° C./min, or even not less than 20° C./min and not more than 70° C./min. Also, it is more favorable for the average temperature raising rate to be within the range of not less than 30° C./min and not more than 70° C./min.

Also, to measure the temperature of the stacked body, a method in which a stacked body to which a thermocouple is mounted passes through the continuous furnace is effective. The temperature raising process, the thermal bonding process, and the temperature lowering process are performed, and the temperature profile of the stacked body is measured. The average temperature raising rate, the holding time of the bonding temperature, and the average temperature lowering rate are calculated from the temperature profile.

The thermal bonding process is a process of thermally bonding the stacked body at the bonding temperature.

The temperature raising process and the thermal bonding process are performed in an inert atmosphere that is one or two selected from a nitrogen atmosphere or an argon atmosphere.

The bonding temperature is within the range of not less than 600° C. and not more than 950° C. The bondability degrades when the bonding temperature is less than 600° C. Warp of the bonded object occurs when the bonding temperature is greater than 950° C. It is therefore favorable for the bonding temperature to be within the range of not less than 600° C. and not more than 950° C., or even not less than 700° C. and not more than 920° C. Also, the temperature range that is controlled to be within a range of ±30° C. of the bonding temperature, which is within the range of not less than 600° C. and not more than 950° C., is taken as the bonding temperature range. For example, when the bonding temperature is 850° C., the bonding temperature range refers to a temperature range controlled to be within the range of 850° C.±30° C. Also, it is favorable to control the bonding temperature range to be within the range of ±10° C. of the bonding temperature. In other words, the temperature at the center of the temperature range of which the fluctuation is suppressed to be within 60° C. is taken as the bonding temperature. The bondability is stable when the bonding temperature is a constant temperature.

When the metal plate is a copper plate, it is favorable for the bonding temperature to be within the range of not less than 700° C. and not more than 950° C., or even not less than 850° C. and not more than 920° C. Also, when the metal plate is an aluminum plate, it is favorable for the bonding temperature to be within the range of not less than 600° C. and not more than 950° C., or even not less than 620° C. and not more than 920° C.

It is favorable for the time that the stacked body is maintained at the bonding temperature to be not less than 3 minutes. The continuous furnace thermally bonds the stacked body while conveying the stacked body. That is, it is favorable for the stacked body maintained at the bonding temperature to be conveyed through the furnace for not less than 3 minutes. Although not particularly limited, it is favorable for the upper limit of the holding time of the bonding temperature to be not more than 60 minutes. A longer holding time of the bonding temperature may result in a longer conveyance distance and a larger continuous furnace. Also, there is a possibility that warp of the bonded object, etc., may occur. It is therefore favorable for the holding time of the bonding temperature to be not less than 3 minutes and not more than 60 minutes, or even not less than 5 minutes and not more than 40 minutes.

The temperature lowering process is a process of cooling the stacked body from the bonding temperature to 200° C. The average temperature lowering rate of the stacked body in the temperature lowering process is not less than 15° C./min. The boundary of the temperature range of the temperature lowering process is set to 200° C. because the solidification reaction of the brazing material layer, which is described below, may occur down to about 300° C. In the temperature lowering process, it is effective to increase the temperature lowering rate to the temperature range in which the solidification reaction of the brazing material layer is substantially completed. By increasing the average temperature lowering rate of the temperature lowering process, the time can be reduced. It is also favorable to perform the temperature lowering process in an inert atmosphere. It is favorable for the inert atmosphere to be a nitrogen atmosphere.

The effect of the time reduction is insufficient when the average temperature lowering rate is less than 15° C./min. Also, the conveyance distance lengthens when the temperature lowering rate is low while conveying the stacked body. A long conveyance distance may result in a larger apparatus. It is therefore effective for the average temperature lowering rate to be not less than 15° C./min. Although not particularly limited, it is favorable for the upper limit of the average temperature lowering rate to be not more than 100° C./min. When the average temperature lowering rate is greater than 100° C./min, thermal stress is generated by the stacked body cooling too quickly, and the reliability of the circuit substrate using the bonded object degrades. Also, there is a possibility that fluctuation of the bondability or discrepancies in the bonding strength, warp of the bonded object, etc., may occur. It is therefore favorable for the average temperature lowering rate to be within the range of not less than 15° C./min and not more than 100° C./min, or even not less than 20° C./min and not more than 70° C./min. Also, it is more favorable for the average temperature lowering rate to be within the range of not less than 30° C./min and not more than 70° C./min.

It is favorable for the difference between the average temperature raising rate and the average temperature lowering rate to be within 20° C./min. The difference between the average temperature raising rate and the average temperature lowering rate is represented by $|\text{average temperature raising rate} - \text{average temperature lowering rate}| \leq 20°$ C./min. A melting reaction and a solidification reaction occur due to the heating of the brazing material layer. These reactions occur in the temperature raising process and the temperature lowering process. The stress that occurs in the reactions can be homogenized by reducing the difference between the average temperature raising rate and the average temperature lowering rate. Discrepancies such as warp, etc., can be suppressed thereby. The temperature raising rate from room temperature to 200° C. is arbitrary. Similarly, the temperature lowering rate from 200° C. to room temperature is arbitrary.

As described above, the bonded object production method using the continuous furnace includes the three processes of the temperature raising process, the thermal bonding process, and the temperature lowering process. These processes may be divided into processing zones inside the continuous furnace. Also, each processing zone may be divided into a plurality. Other than the conveyance path of the stacked body, partitions or the like may be provided at the boundaries between the zones. It is effective to set the heating temperatures of the zones according to the average temperature raising rate of the stacked body in the temperature raising process and the bonding temperature of the stacked body in the thermal bonding process.

For example, the heating temperature can be controlled by regulating the temperatures of the heaters located in each zone. Also, in the temperature lowering process, temperature control for temperature lowering (e.g., temperature control by a cooling mechanism) may be performed.

For example, the temperature raising process may be divided into multiple processing zones such as a room temperature zone, zones from room temperature to 200° C., from 200° C. to 400° C., from 400° C. to 600° C., and from 600° C. to the bonding temperature, and a zone maintained at the bonding temperature.

In the processing zone of the initial heating of the temperature raising process, it is favorable for the temperature of the stacked body to be within the range of not less than 150° C. and not more than 400° C. The processing zone of the initial heating is the initial heating zone inside the continuous furnace. The bonded object production method according to the embodiment controls the temperature raising rate in the temperature raising process from 200° C. to the bonding temperature. The temperature raising rate from 200° C. is easily controlled by setting the temperature of the stacked body in the processing zone of the initial heating to be within the range of not less than 150° C. and not more than 400° C. It is therefore favorable for the temperature of the stacked body in the processing zone of the initial heating to be within the range of not less than 150° C. and not more than 400° C., or even not less than 180° C. and not more than 370° C. Also, this temperature range provides the effect of degreasing the binder in the brazing material paste.

Also, the interior of the continuous furnace is not an airtight space. For example, the pressure inside the continuous furnace is atmospheric pressure.

It is favorable to perform the temperature raising process, the thermal bonding process, and the temperature lowering process in an inert atmosphere. The inert atmosphere is one or two selected from a nitrogen atmosphere or an argon atmosphere. Nitrogen is less expensive than argon. It is therefore favorable for the inert atmosphere to be a nitrogen atmosphere. It is favorable for the nitrogen ratio in the nitrogen atmosphere to be within the range of not less than 90 volume % and not more than 100 volume %. The bondability may be unfavorably affected when the nitrogen ratio in the nitrogen atmosphere is less than 90 volume %.

For example, the bondability may be unfavorably affected due to oxidization of the brazing material layer when the content of oxygen gas increases. It is therefore favorable for the ratio of nitrogen in the nitrogen atmosphere to be within the range of not less than 90 volume % and not more than 100 volume %, or even not less than 98 volume % and not more than 100 volume %. The purity of the nitrogen gas provided to the continuous furnace is considered to be the ratio of nitrogen in the nitrogen atmosphere. Also, when the temperature raising process, the thermal bonding process, and the temperature lowering process are divided into multiple processing zones, the purity (volume %) of the nitrogen gas provided in each processing zone is considered to be the ratio of nitrogen in the nitrogen atmosphere. Also, it is favorable for the dew point of the nitrogen gas to be within the range of not less than −50° C. and not more than 0° C. The dew point can be ascertained by measuring the dew point of the nitrogen gas supplied to the continuous furnace. The dew point is the temperature at which water vapor in the gas condenses. By setting the dew point of the nitrogen gas to be within the range described above, the occurrence of water vapor inside the continuous furnace can be suppressed. It is effective to control the dew point of the nitrogen gas because the presence of water vapor in the atmosphere inside the continuous furnace affects the bondability.

Figure 4:
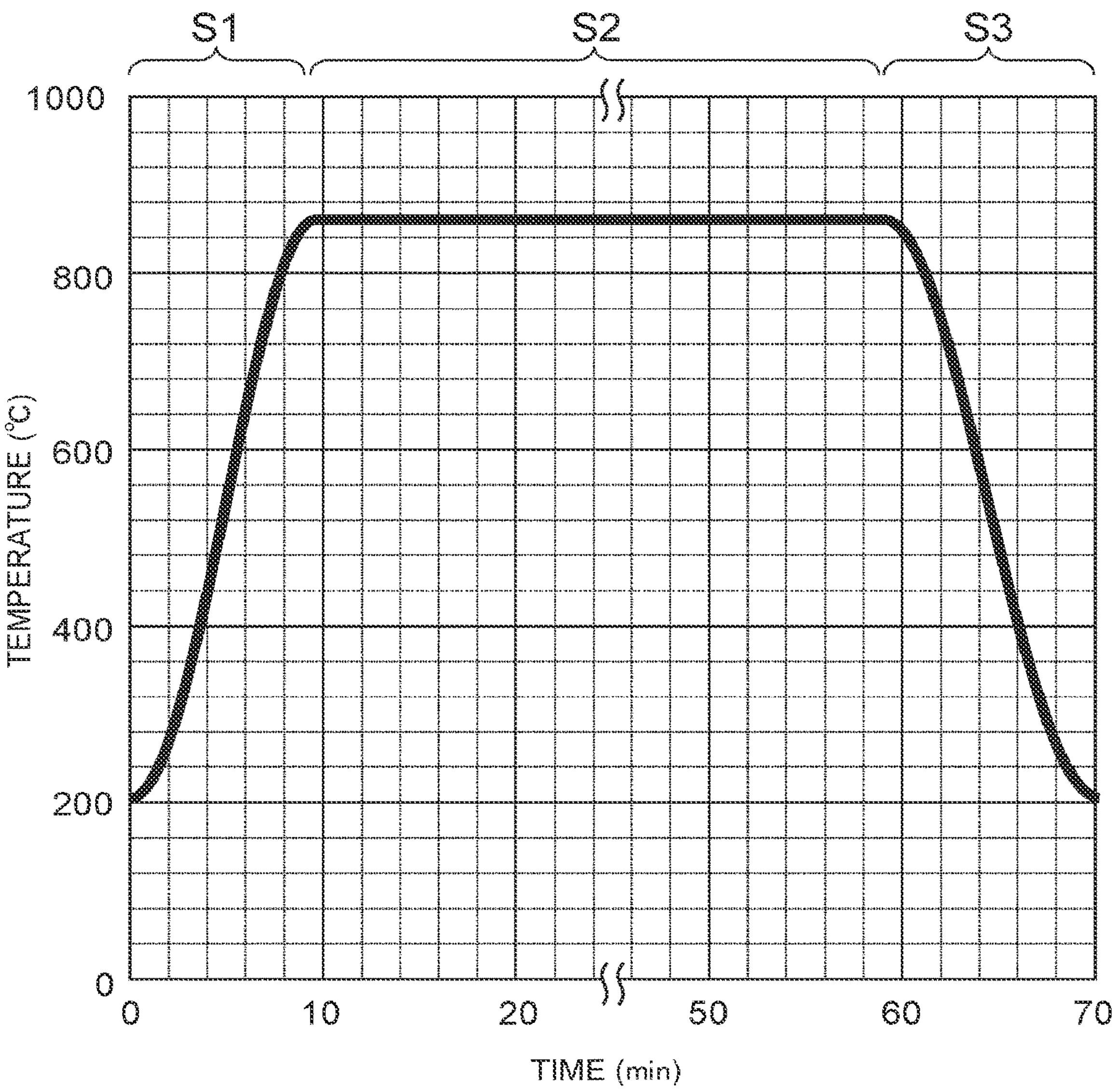
FIG. 4 shows an example of a temperature profile of the stacked body in the continuous furnace.

FIG. 4 is an example of the temperature profile of the stacked body in the continuous furnace. In the graph shown in FIG. 4, the horizontal axis is time, and the vertical axis is the temperature of the stacked body. FIG. 4 shows the temperature profile in the continuous furnace when the temperature of the stacked body is not less than 200 degrees.

In the example shown in FIG. 4, the stacked body is heated to 200° C. in the processing zone of the initial heating of the temperature raising process. The stacked body is heated to 860° C. in a subsequent temperature raising process S1. The average temperature raising rate is about 70° C./min. After the temperature raising process S1, the stacked body is maintained for 50 minutes at the bonding temperature of 860° C. in a thermal bonding process S2. After the thermal bonding process S2, the stacked body is cooled to 200° C. in a temperature lowering process S3. The average temperature lowering rate is about 60° C./min.

Also, it is favorable for the average conveyance speed of the stacked body to be not less than 1 cm/min. The average conveyance speed is the average value of the movement speed of the stacked body when conveyed through the temperature raising process, the thermal bonding process, and the temperature lowering process. When the average conveyance speed is less than 1 cm/min, the suitability for mass production may degrade due to the low conveyance speed. When a process of stopping the conveyance is included, the stop time is counted as a conveyance speed of 0 cm/min. For example, for a process having a conveyance speed of 5 cm/min for 30 minutes and a conveyance speed of 10 cm/min for 10 minutes, the average conveyance speed is 6.3 cm/min. Also, for a process having a conveyance speed of 5 cm/min for 60 minutes and stopped conveyance for 30 minutes, the average conveyance speed is 3.3 cm/min.

Although not particularly limited, it is favorable for the upper limit of the average conveyance speed to be not more than 30 cm/min. When the average conveyance speed is high, the conveyance distance lengthens, which may result in a larger process. Also, when the average conveyance speed is high, the heat transfer to the stacked body may become nonuniform. It is therefore favorable for the average conveyance speed to be within the range of not less than 1 cm/min and not more than 30 cm/min, or even not less than 8 cm/min and not more than 20 cm/min. Within this range, the heat transfer to the stacked body can be uniform, and the suitability for mass production can be improved.

It is favorable for the inert atmosphere to be introduced through the supply pipe 7 and discharged through the exhaust pipe 8. When divided into processing zones, the supply pipe 7 and the exhaust pipe 8 may be provided in each processing zone, or the supply pipe 7 and the exhaust pipe 8 may straddle the processing zones.

There are also cases where a gas is emitted from the brazing material layer when heating the stacked body. Examples of the gas include oxygen gas, hydrocarbon gas, carbon dioxide gas, carbon monoxide gas, etc. It is favorable to provide the exhaust pipe 8 to prevent the accumulation of the gas emitted from the brazing material layer. Also, it is favorable for the supply pipe 7 to be frontward and the exhaust pipe 8 to be backward in the conveyance direction of the stacked body 5 inside the continuous furnace 10. Contact with the stacked body 5 of the gas emitted from the brazing material layer can be suppressed thereby. The metal plate surface may be discolored when the gas emitted from the brazing material accumulates.

Also, the belt conveyor-type is favorable for the conveyance inside the continuous furnace. It is easy to control the conveyance speed with the belt conveyor-type. When conveying, the stacked body may be placed directly on the belt conveyor. The stacked body may be placed on a transfer tray; and the transfer tray may be placed on the belt conveyor. A mesh belt may be used as the conveyor belt. When a transfer tray is used, a walking-beam-type may be used to convey the stacked body inside the continuous furnace.

Examples of the ceramic substrate 2 include a silicon nitride substrate, an aluminum nitride substrate, an aluminum oxide substrate, an Alusil substrate, etc. The Alusil substrate is a substrate in which aluminum oxide and zirconium oxide are mixed.

It is favorable for the thickness of the ceramic substrate 2 to be not less than 0.1 mm and not more than 2 mm. When the substrate thickness is less than 0.1 mm, there is a possibility that the strength may be reduced. When the substrate thickness is greater than 2 mm, there is a possibility that the ceramic substrate may become a thermal resistor, and the heat dissipation of the ceramic circuit substrate may be degraded. It is therefore favorable for the thickness of the ceramic substrate 2 to be not less than 0.1 mm and not more than 2 mm, or even not less than 0.1 mm and not more than 1 mm.

It is favorable for the three-point bending strength of the silicon nitride substrate to be not less than 500 MPa. Also, it is favorable for the thermal conductivity of the silicon nitride substrate to be not less than 60 W/m·K. The substrate thickness can be reduced by increasing the strength of the silicon nitride substrate. It is therefore favorable for the three-point bending strength of the silicon nitride substrate to be not less than 500 MPa, or even not less than 650 MPa. The substrate thickness of the silicon nitride substrate can be thin, i.e., not more than 0.40 mm, or even not more than 0.30 mm. The thickness of the silicon nitride substrate is not limited to being not more than 0.40 mm. The thickness of the ceramic substrate may be changed as necessary.

The three-point bending strength of the aluminum nitride substrate is about 300 to 450 MPa. On the other hand, the thermal conductivity of the aluminum nitride substrate is not less than 160 W/m·K. Because the strength of the aluminum nitride substrate is low, it is favorable for the substrate thickness to be not less than 0.60 mm.

Although the three-point bending strength of the aluminum oxide substrate is about 300 to 450 MPa, the aluminum oxide substrate is inexpensive. Although the three-point bending strength of the Alusil substrate is high, i.e., about 550 MPa, the thermal conductivity is about 30 to 50 W/m·K.

A silicon nitride substrate is favorable as the ceramic substrate. Because the strength of the silicon nitride substrate is high, excellent reliability can be obtained even when a thick copper plate is bonded.

Examples of the metal plate 4 include a copper plate, an aluminum plate, and an iron alloy plate. Also, the copper plate is not limited to a pure copper plate and may be a copper alloy plate. Examples of the copper plate include those shown in JIS-H-3100 (2018). JIS-H-3100 (2018) corresponds to ISO 1337, etc. Among these, oxygen-free copper (having a copper purity of not less than 99.96 mass %) is favorable. Oxygen-free copper is one type of pure copper plate. The aluminum plate is not limited to a pure aluminum plate, and may be an aluminum alloy plate. Examples of the aluminum plate include those shown in JIS-H-4000 (2014). JIS-H-4000 (2014) corresponds to ISO 209 (2007). Also, it is favorable for the metal plate to be a copper plate. This is because copper plates have higher thermal conductivities than aluminum plates. Examples of the iron alloy plate include stainless steel. Stainless steel is one type of iron alloy including Cr. Stainless steel is indicated by SUS in JIS Standards (Japanese Industrial Standards).

Also, it is favorable for the thickness of the metal plate 4 to be not less than 0.2 mm. By making the metal plate 4 thick, both the heat dissipation and the current-carrying capacity can be improved. It is therefore favorable for the thickness of the metal plate 4 to be not less than 0.2 mm, or even not less than 0.5 mm. Although not particularly limited, it is favorable for the upper limit of the thickness of the metal plate 4 to be not more than 10 mm. When the metal plate is greater than 10 mm, the burden of patterning into the desired shape may increase. Also, when the metal plate is thick, i.e., greater than 3 mm, it may be difficult to perform the etching process described below. Therefore, when performing the etching process, it is favorable for the thickness of the metal plate to be not less than 0.2 mm and not more than 3 mm, or even not less than 0.5 mm and not more than 2 mm. Also, when an etching process is not performed, a metal plate that is patterned into the desired shape is used.

Also, the longitudinal and lateral sizes of the ceramic substrate 2 may be equal to or different from the longitudinal and lateral sizes of the metal plate 4. The longitudinal and lateral sizes of the ceramic substrate 2 and the longitudinal and lateral sizes of the metal plate 4 being equal means that the difference between the length of the ceramic substrate 2 and the length of the metal plate 4 is within the range of ±2 mm.

By setting the longitudinal and lateral sizes of the ceramic substrate 2 and the longitudinal and lateral sizes of the metal plate 4 to be equal, the degree of freedom of the pattern formation by the etching process is increased. Also, when the metal plate 4 is provided at two surfaces of the ceramic substrate 2, warp of the bonded object can be suppressed by setting the longitudinal and lateral sizes of the ceramic substrate 2 and the longitudinal and lateral sizes of the metal plate 4 to be equal. Also, by setting the longitudinal and lateral sizes of the ceramic substrate 2 and the longitudinal and lateral sizes of the metal plate 4 to be equal, the degree of freedom of the circuit pattern by the etching process is increased.

Also, when the longitudinal and lateral sizes of the ceramic substrate 2 and the longitudinal and lateral sizes of the metal plate 4 are different, it is favorable to set the longitudinal and lateral sizes of the metal plate at the front side and the longitudinal and lateral sizes of the metal plate at the backside to be equal. In such a case as well, the occurrence of the warp can be suppressed.

The metal plate 4 may be pre-patterned into a pattern shape before being mounted on the ceramic substrate 2. By using a metal plate that is pre-patterned into a pattern shape, the etching process can be omitted.

The bonded object may be used in multi-part manufacturing. Multi-part manufacturing is a method in which a bonded object is subdivided into a plurality to obtain small bonded objects. For example, multiple ceramic circuit substrates can be obtained by subdividing a bonded object provided with a circuit configuration by patterning by etching. In the bonded object production method according to the embodiment, the warp amount can be suppressed even when the long side of the ceramic substrate is enlarged to be not less than 100 mm. Therefore, a bonded object that is suited to multi-part manufacturing can be made. It is necessary to perform a warp correction process for a bonded object having a large warp amount. By reducing the warp amount, the warp correction process can be made unnecessary.

Figure 5:
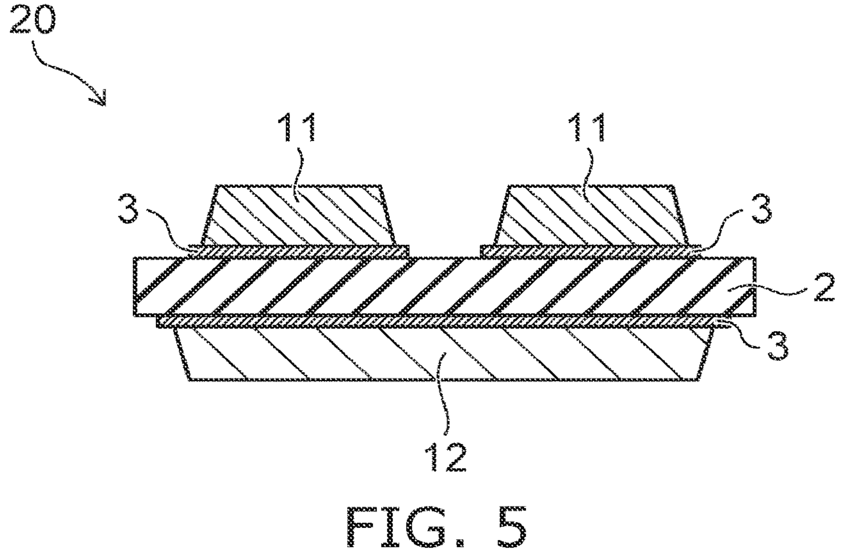
FIG. 5 shows an example of a ceramic circuit substrate according to the embodiment.

FIG. 5 is an example of a ceramic circuit substrate made by patterning the bonded object. In FIG. 5, 11 is a circuit part, 12 is a heat dissipation plate, and 20 is a ceramic circuit substrate.

The circuit part 11 is a circuit part in which the metal plate 4 at the front side is provided with a circuit structure. The heat dissipation plate 12 is a heat dissipation plate in which the metal plate 4 at the backside is patterned. Although two circuit parts 11 are provided in the example shown in FIG. 5, the structure of the ceramic circuit substrate is not limited to the example. The number and shapes of the circuit parts 11 are arbitrary. Also, the metal plates 4 at two surfaces of the ceramic substrate 2 may be patterned into the circuit parts 11. Also, an oblique structure may be provided in the side surfaces of the circuit part 11 and the heat dissipation plate 12. A brazing material layer jutting portion at which the brazing material layer 3 juts from the end portion of the circuit part 11 or the heat dissipation plate 12 may be provided.

It is favorable for the brazing material layer 3 to include an active metal brazing material. A bonding method that uses an active metal brazing material is called active metal bonding. When the metal plate is a copper plate, the active metal is titanium (Ti). The active metal brazing material is a brazing material that includes Ti. Ti can increase the bonding strength by reacting with the ceramic substrate. When the ceramic substrate is a nitride ceramic substrate, titanium nitride is formed as a reaction layer. When the ceramic substrate is an oxide ceramic substrate, titanium oxide is formed as the reaction layer.

It is favorable for the brazing material to include one, two, or more selected from Ag (silver), Cu (copper), Sn (tin), In (indium), and C (carbon) as components other than the active metal. Ag or Cu is a component used as the base material of the brazing material. Sn or In has the effect of lowering the melting point of the brazing material. C has the effect of controlling the fluidity of the brazing material and/or controlling the composition of the bonding layer by reacting with other components. Therefore, examples of the components of the brazing material include Ag—Cu—Ti, Ag—Cu—Sn—Ti, Ag—Cu—Ti—C, Ag—Cu—Sn—Ti—C, Ag—Ti, Cu—Ti, Ag—Sn—Ti, Cu—Sn—Ti, Ag—Ti—C, Cu—Ti—C, Ag—Sn—Ti—C, and Cu—Sn—Ti—C. In may be used instead of Sn. Both Sn and In may be used. Instead of Sn or In, a low melting-point metal such as Bi (bismuth), Sb (antimony), Ga (gallium), etc., may be used.

It is favorable for the brazing material composition to include not less than 0 mass % and not more than 70 mass % of Ag (silver), not less than 15 mass % and not more than 85 mass % of Cu (copper), and not less than 1 mass % and not more than 15 mass % of Ti (titanium) or $TiH_2$ (titanium hydride). Also, when both Ti and $TiH_2$ are used, the total is within the range of not less than 1 mass % and not more than 15 mass %. Also, when both Ag and Cu are used, it is favorable for Ag to be 20 to 60 mass %, and Cu to be 15 to 40 mass %. Also, for these brazing material compositions, the bonding temperature can be controlled within the range of not less than 700° C. and not more than 950° C.

As necessary, the brazing material composition may include not less than 1 mass % and not more than 50 mass % of one or two of Sn (tin) or In (indium). Also, as necessary, the brazing material composition may include not less than 0.1 mass % and not more than 2 mass % of C (carbon).

Also, when the metal plate is an aluminum plate, the active metal is silicon (Si). The brazing material component other than Si is aluminum. That is, the active metal brazing material when bonding the aluminum plate is an Al—Si brazing material. It is favorable for the Al—Si brazing material to include Si within the range of not less than 0.1 mass % and not more than 30 mass %. Also, other than Al and Si, magnesium may be included to be within the range of not less than 0.01 mass % and not more than 10 mass %. Also, for these brazing material compositions, the bonding temperature can be controlled within the range of not less than 600° C. and not more than 950° C.

The ratios of the brazing material composition are calculated using the total of the mixed raw materials as 100 mass %. For example, when the three of Ag, Cu, and Ti are included, Ag+Cu+Ti=100 mass %. Also, when the four of Ag, Cu, $TiH_2$, and In are included, Ag+Cu+$TiH_2$+In=100 mass %. Also, when the five of Ag, Cu, Ti, Sn, and C are included, Ag+Cu+Ti+Sn+C=100 mass %. Also, when the two of Al and Si are included, Al+Si=100 mass %.

It is favorable for the melting point of the brazing material to be less than the bonding temperature. Also, it is favorable for the melting point of the brazing material to be not more than 700° C. By reducing the melting point of the brazing material, the metal plate and the ceramic substrate can be bonded even when the temperature raising rate and the temperature lowering rate are increased. A high temperature raising rate means that the temperature rise from room temperature to the bonding temperature is fast. By lowering the melting point of the brazing material, the brazing material can be melted in the temperature rise process. As a result, the bonding can be started in the temperature raising process. Although not particularly limited, it is favorable for the lower limit of the melting point of the brazing material to be not less than 530° C. When the melting point of the brazing material is less than 530° C., the TCT characteristics may degrade when the melting point is too low. With the higher performance of semiconductor elements in recent years, junction temperatures have increased to about 170° C. With further performance improvements, junction temperatures are expected to reach 250° C. If the melting point of the brazing material is low, there is a possibility that the brazing material layer may melt at the junction temperature. It is therefore favorable for the melting point of the brazing material to be within the range of not less than 530° C. and not more than 700° C., or even not less than 530° C. and not more than 590° C.

The melting point of the brazing material is determined by examining the DSC curve. The DSC curve includes the peaks of endothermic reactions and exothermic reactions measured using a differential scanning calorimeter (DSC). A peak in the negative direction is an endothermic reaction; and a peak in the positive direction is an exothermic reaction.

Also, the DSC curve is measured over a temperature profile made of a temperature raising process, a holding process at a constant temperature, and a temperature lowering process. In the temperature profile, the temperature raising process raises the temperature from room temperature to 500° C. at a temperature raising rate of 5° C./min. Then, 500° C. is maintained for 60 minutes. Then, the temperature is raised to 845° C. at a temperature raising rate of 5° C./min. The holding process maintains 845° C. for 30 minutes. The temperature lowering process is a process of lowering from 845° C. to room temperature at the temperature lowering rate of 5° C./min.

The TGA-DSC simultaneous thermal analyzer STA449-F3-Jupiter made by NETZSCH or an apparatus having equivalent performance can be used as the measurement device of the DSC. Also, the measurement is performed in an Ar (argon) flow by dropping the appropriate amount of the brazing material into an alumina container. It is necessary to prevent the brazing material and the atmosphere from reacting by measuring in an Ar atmosphere.

In the temperature raising process of the DSC curve, the detected temperature of the largest endothermic peak in the temperature range of not less than 530° C. and not more than 900° C. is taken to be the melting point. The melting point of the brazing material being not more than 700° C. means that the largest endothermic peak exists within the range of 530 to 700° C. Also, when the melting point is greater than 700° C., the largest endothermic peak is greater than 700° C., and is detected at 900° C. Even if there is a peak in the negative direction at less than 550° C., such a peak may not be counted as an endothermic peak. Such an endothermic reaction is caused by melting, decomposition, etc., of the active metal brazing material. For example, when titanium hydride ($TiH_2$) is used as the active metal, a peak in the negative direction is detected at about 500° C. This peak is a peak when $TiH_2$ decomposes into Ti and H.

Also, to lower the melting point of the brazing material, it is effective to set the mass ratio Ag/Cu of the mass of Ag to the mass of Cu included in the brazing material to be within the range of not less than 0 and not more than 1.3. Most favorably, the composition does not include Ag (mass ratio Ag/Cu=0). "Not including Ag" refers to a content ratio of Ag of not more than 0.01 mass % (including zero). When the content ratio of Ag is not more than 0.01 mass %, the mass ratio Ag/Cu can be considered to be zero. Also, it is favorable to add one or two selected from Sn or In to the brazing material. It is also effective to set the grain size of Sn or In to be the largest among the components included in the brazing material. For example, the grain size of Sn is set to be the largest in a brazing material made of Cu, Sn, and Ti. Also, the grain size of Sn is set to be the largest in a brazing material made of Ag, Cu, Sn, $TiH_2$, and C.

It is favorable for the average grain size of the materials included in the brazing material to be within the range of not less than 0.5 μm and not more than 15 μm. It is effective to control the grain size of the Sn powder or the In powder within this range. Among the materials included in the brazing material, the melting point of the Sn powder or the In powder is low. By other materials being present around a material having a low melting point, the melting reaction can occur smoothly even when the temperature raising rate is increased.

After mixing the material powders included in the active metal brazing material, the active metal brazing material paste is prepared. The active metal brazing material paste is obtained by adding a solvent, a binder, etc., to the mixed powder. The coating area, thickness, and the like of the brazing material layer can be adjusted by using a paste.

Also, it is favorable for the thickness of the active metal brazing material layer to be within the range of not less than 10 μm and not more than 60 μm. The paste is coated so that the thickness of the brazing material layer after the thermal bonding is within the range.

The active metal brazing material paste is coated onto the ceramic substrate 2; and the copper plate 4 is placed. Also, the active metal brazing material paste may be coated onto the copper plate 4; and the ceramic substrate 2 may be placed. The active metal brazing material paste may be coated onto two surfaces of the ceramic substrate 2; and the copper plate 4 may be placed on the two surfaces.

After the stacked body is made, a production method that uses the continuous furnace described above is applied.

Examples 1 to 5, Comparative Examples 1 to 2, and Reference Example 1

A silicon nitride substrate, an aluminum nitride substrate, and an aluminum oxide substrate were prepared as ceramic substrates. The thermal conductivity of the silicon nitride substrate was 90 W/m·K; and the three-point bending strength was 650 MPa. The thermal conductivity of the aluminum nitride substrate was 170 W/m·K; and the three-point bending strength was 400 MPa. The thermal conductivity of the aluminum oxide substrate was 20 W/m·K; and the three-point bending strength was 430 MPa. The longitudinal length, lateral length, and thickness of each substrate were as shown in Table 1.

TABLE 1

| Ceramic substrate | Length × Width × Thickness (mm) |
|---|---|
| Silicon nitride substrate 1 | 90 × 100 × 0.25 |
| Silicon nitride substrate 2 | 140 × 190 × 0.32 |
| Aluminum nitride substrate 1 | 100 × 100 × 0.635 |
| Aluminum oxide substrate 1 | 200 × 180 × 0.635 |

Then, the brazing material layers shown in Table 2 were prepared. The brazing material layer was an active metal brazing material including Ti. The average grain size of the materials included in the brazing material was within the range of not less than 0.5 μm and not more than 15 μm. Also, in the brazing materials 1 to 4, the grain size of the Sn powder was the largest. In the brazing material 5, the grain size of the Cu powder was the largest.

TABLE 2

| Brazing material layer | Brazing material composition (wt %) | Melting point (° C.) |
|---|---|---|
| Brazing material 1 | Ag(36.7), Cu(34.5), Sn(20), $TiH_2$(8.7), C(0.1) | 612 |
| Brazing material 2 | Ag(44.3), Cu(37.1), Sn(16), $TiH_2$(2.6) | 584 |
| Brazing material 3 | Cu(67.2), Sn(21), $TiH_2$(11.8) | 578 |
| Brazing material 4 | Cu(62.5), Sn(27.5), $TiH_2$(9.7), C(0.3) | 562 |
| Brazing material 5 | Ag(63), Cu(24), Sn(10), $TiH_2$(3) | 753 |
| Brazing material 6 | Al(99.2), Si(0.8) | 585 |

Then, the copper plate and the aluminum plate were prepared. An oxygen-free copper plate made of pure copper was used as the copper plate. The thicknesses of the copper plate and the aluminum plate were as shown in Table 3.

TABLE 3

| | Thickness of metal plate (mm) |
|---|---|
| Copper plate 1 | 0.8 |
| Copper plate 2 | 0.5 |
| Copper plate 3 | 0.3 |
| Aluminum plate 1 | 0.3 |

Then, the active metal brazing material was prepared as a paste. Subsequently, a stacked body having the five-layer structure of copper plate/brazing material layer/ceramic substrate/brazing material layer/copper plate was made. The longitudinal and lateral sizes of the copper plates at the front side and the backside and the longitudinal and lateral sizes of the aluminum plates at the front side and the backside were 2 mm smaller than the longitudinal and lateral sizes of the ceramic substrate. Also, after printing the active metal brazing material paste, drying was performed for 20 minutes in an ambient-air atmosphere at 100° C. The thickness of the brazing material layer after drying was within the range of not less than 10 μm and not more than 60 μm. The configurations of the stacked bodies were as shown in Table 4.

TABLE 4

| | Metal plate | Brazing material layer | Ceramic substrate | Brazing material layer | Metal plate |
|---|---|---|---|---|---|
| Stacked body 1 | Copper plate 1 | Brazing material layer 1 | Silicon nitride substrate 1 | Brazing material layer 1 | Copper plate 1 |
| Stacked body 2 | Copper plate 2 | Brazing material layer 2 | Silicon nitride substrate 2 | Brazing material layer 2 | Copper plate 2 |
| Stacked body 3 | Copper plate 1 | Brazing material layer 3 | Silicon nitride substrate 2 | Brazing material layer 3 | Copper plate 1 |
| Stacked body 4 | Copper plate 2 | Brazing material layer 4 | Silicon nitride substrate 1 | Brazing material layer 4 | Copper plate 2 |
| Stacked body 5 | Copper plate 1 | Brazing material layer 4 | Silicon nitride substrate 2 | Brazing material layer 4 | Copper plate 1 |
| Stacked body 6 | Copper plate 3 | Brazing material layer 1 | Aluminum nitride substrate 1 | Brazing material layer 1 | Copper plate 3 |
| Stacked body 7 | Copper plate 3 | Brazing material layer 3 | Aluminum nitride substrate 1 | Brazing material layer 3 | Copper plate 3 |
| Stacked body 8 | Copper plate 1 | Brazing material layer 5 | Silicon nitride substrate 2 | Brazing material layer 5 | Copper plate 1 |

TABLE 4-continued

| | Metal plate | Brazing material layer | Ceramic substrate | Brazing material layer | Metal plate |
|---|---|---|---|---|---|
| Stacked body 9 | Copper plate 3 | Brazing material layer 1 | Aluminum oxide substrate 1 | Brazing material layer 1 | Copper plate 3 |
| Stacked body 10 | Aluminum plate 1 | Brazing material layer 6 | Silicon nitride substrate 2 | Brazing material layer 6 | Aluminum plate 1 |

The bonding process of the stacked bodies was performed using a continuous furnace. The bonding conditions were as shown in Table 5. A belt conveyor-type continuous furnace was used. The holding time in the thermal bonding process was the time maintained within the range of the bonding temperature±10° C. The "initial processing zone temperature" refers to the temperature to which the stacked body was heated in the initial processing zone of the temperature raising process.

The temperature raising process, the thermal bonding process, and the temperature lowering process each were performed in a nitrogen atmosphere. The nitrogen atmosphere was an atmosphere of which the ratio of the nitrogen gas was within the range of not less than 98 volume % and not more than 100 volume %. The nitrogen gas was supplied through the supply pipe and discharged through the exhaust pipe. Also, the supply pipe was located frontward in the travel direction of the stacked body.

The interior of the continuous furnace was divided into multiple processing zones; and the temperature raising process, the thermal bonding process, and the temperature lowering process were performed in the multiple processing zones. Also, in the processing zone of the initial heating of the stacked body in the temperature raising process, the stacked bodies were heated to the temperatures shown in Table 5.

Also, in the comparative example 1, the bonding temperature was outside the range of not less than 600° C. and not more than 950° C. In the comparative example 2, the average temperature raising rate and the average temperature lowering rate were less than 15° C./min. Also, the bonding temperature was outside the range of not less than 600° C. and not more than 950° C. The reference example 1 was an example of the example 3 in which the average temperature raising rate and the average temperature lowering rate were set to be less than 15° C./min.

TABLE 5

| | | Temperature raising process | | | | Temperature lowering process | |
|---|---|---|---|---|---|---|---|
| | | Processing zone temperature | Average temperature raising rate from 200° C. | Thermal bonding process | | Average temperature lowering rate from bonding | Average |
| | Stacked body | of initial heating (° C.) | to bonding temperature (° C./min) | Bonding temperature (° C.) | Holding time (min) | temperature to 200° C. (° C./min) | conveyance speed (cm/min) |
| Example 1 | Stacked body 1 | 330 | 22 | 760 | 50 | 28 | 2 |
| Example 2 | Stacked body 2 | 150 | 30 | 750 | 60 | 70 | 10 |
| Example 3 | Stacked body 3 | 390 | 50 | 840 | 60 | 50 | 15 |
| Example 4 | Stacked body 3 | 200 | 70 | 880 | 50 | 60 | 10 |
| Example 5 | Stacked body 4 | 230 | 30 | 840 | 60 | 30 | 5 |
| Example 6 | Stacked body 4 | 260 | 40 | 850 | 40 | 50 | 5 |
| Example 7 | Stacked body 5 | 270 | 50 | 860 | 60 | 50 | 3 |
| Example 8 | Stacked body 5 | 220 | 40 | 860 | 60 | 60 | 10 |
| Example 9 | Stacked body 6 | 150 | 60 | 840 | 60 | 60 | 10 |
| Example 10 | Stacked body 7 | 230 | 90 | 820 | 70 | 80 | 10 |
| Example 11 | Stacked body 3 | 250 | 18 | 860 | 15 | 20 | 17 |
| Example 12 | Stacked body 4 | 260 | 25 | 840 | 20 | 25 | 14 |
| Example 13 | Stacked body 4 | 300 | 35 | 840 | 30 | 35 | 10 |
| Example 14 | Stacked body 9 | 250 | 33 | 850 | 40 | 40 | 10 |
| Example 15 | Stacked body 10 | 160 | 38 | 660 | 40 | 38 | 10 |
| Comparative example 1 | Stacked body 8 | 150 | 25 | 980 | 60 | 25 | 5 |
| Comparative example 2 | Stacked body 8 | 450 | 5 | 880 | 50 | 5 | 5 |
| Reference example 1 | Stacked body 8 | 150 | 5 | 840 | 60 | 5 | 15 |

The bonded objects were manufactured by the method described above. One hundred bonded objects of each were made. First, the warp amount of the bonded objects thus obtained was measured. To measure the warp amount, the warp amount at the long side of the ceramic substrate was measured. The percentages of the bonded objects having warp amounts of "not more than 1 mm" and "greater than 1 mm and not more than 3 mm" were determined.

Also, the percentage of bonding defects was measured. When a void exists in the brazing material layer, the portion that includes the void becomes an unbonded portion. For the bonding defects, the area ratio (%) of the unbonded portions was determined by acquiring flaw detection images of the bonded objects with an ultrasonic flaw detection device and by performing image analysis. The resolution of the ultrasonic flaw detection was 0.5 $mm^2$; and the sum of the area ratio of unbonded portions at the front side and the area ratio of unbonded portions at the backside was used as the area ratio of unbonded portions.

The bonded objects of which the area ratio (%) of unbonded portions was not less than 0% and not more than 5% were considered "good"; and the bonded objects of which the area ratio (%) of unbonded portions was greater than 5% were considered "defective". Among the good parts, the bonded objects that satisfied the following two conditions were considered "best". The first condition was that the area ratio (%) of unbonded portions was not less than 0% and not more than 2%. The second condition was that there were not less than zero and not more than two voids of which the area of the unbonded portion was greater than 3.14 $mm^2$.

The results are shown in Table 6.

TABLE 6

| | Warp amount | | Bonding strength |
|---|---|---|---|
| | Percentage not more than 1 mm (%) | Percentage greater than 1 mm and not more than 3 mm (%) | Area ratio of unbonded portions |
| Example 1 | 100 | 0 | Best |
| Example 2 | 96 | 4 | Good |
| Example 3 | 99 | 1 | Best |
| Example 4 | 100 | 0 | Best |
| Example 5 | 100 | 0 | Best |
| Example 6 | 100 | 0 | Best |
| Example 7 | 100 | 0 | Best |
| Example 8 | 100 | 0 | Best |
| Example 9 | 98 | 2 | Best |
| Example 10 | 98 | 2 | Best |
| Example 11 | 100 | 0 | Best |
| Example 12 | 100 | 0 | Best |
| Example 13 | 100 | 0 | Best |
| Example 14 | 98 | 2 | Best |
| Example 15 | 100 | 0 | Good |
| Comparative example 1 | 95 | 5 | Defective |
| Comparative example 2 | 74 | 13 | Defective |
| Reference example 1 | 98 | 2 | Best |

It can be seen from Table 6 that the yield of the bonded object was found to be good in the examples. Here, "yield" was the percentage of bonded objects of which the warp amount was not more than 1 mm and the area ratio of unbonded portions was not more than 3%. The suitability for mass production can be improved by increasing the temperature raising rate and the temperature lowering rate by using a continuous furnace. Also, an evacuation process such as that of a batch furnace is unnecessary. In this respect as well, the suitability for mass production is improved.

According to the production method according to the example, bonded objects that had long sides of not less than 100 mm as in the silicon nitride substrate 2 or the aluminum nitride substrate 1 could be bonded. Therefore, multi-part manufacturing also is possible.

The yield slightly decreased when the difference between the temperature raising rate and the temperature lowering rate was greater than 20° C./min as in the example 2. Also, comparing the example 3 and the reference example 1, it can be seen that bonding was possible even when the temperature raising rate and the temperature lowering rate were increased as in the example 3. This was because a brazing material having a melting point of not more than 700° C. was used. It was found that by using an active metal brazing material having a low melting point, good thermal bonding was possible even when the temperature raising rate and the temperature lowering rate were increased.

Also, the warp of the bonded object tended to be larger when using a ceramic substrate having a three-point bending strength of not more than 500 MPa as in the examples 9, 10, and 14. In this respect, it can be seen that it is favorable to use a silicon nitride substrate having a high three-point bending strength as the bonded object.

Also, ceramic circuit substrates were manufactured by patterning the metal member of the bonded object by etching. A TCT test (heat resistance cycle test) performed with a low-temperature side of −40° C. and a high-temperature side of 175° C. showed excellent durability. The ceramic circuit substrates that used the bonded objects according to the examples had excellent TCT characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments herein may be made without departing from the spirit of the inventions. The accompanying claims and their equivalents are intended to cover such forms or modifications as would fall within the scope and spirit of the inventions. Also, the embodiments described above can be implemented in combination with each other.

What is claimed is:

1. A bonded object production method using a continuous furnace to process a stacked body while conveying the stacked body, the stacked body including a metal member, a ceramic member, and a brazing material layer located between the metal member and the ceramic member, the method comprising:

heating the stacked body in an inert atmosphere from 200° C. to a bonding temperature at an average temperature raising rate of the stacked body of not less than 15° C./min;

bonding the stacked body in an inert atmosphere at the bonding temperature, the bonding temperature being within a range of not less than 600° C. and not more than 950° C.; and cooling the stacked body from the bonding temperature to 200° C. at an average temperature lowering rate of the stacked body of not less than 15° C./min, wherein the inert atmosphere in the heating and the inert atmosphere in the bonding are nitrogen atmospheres having nitrogen concentrations within a range of not less than 90 volume % and not more than 100 volume %.

2. The bonded object production method according to claim 1, wherein the average temperature raising rate is within a range of not less than 20° C./min and not more than 100° C./min.

3. The bonded object production method according to claim 1, wherein the average temperature lowering rate is within a range of not less than 20° C./min and not more than 100° C./min.

4. The bonded object production method according to claim 1, wherein an average conveyance speed of the stacked body is not less than 1 cm/min.

5. The bonded object production method according to claim 1, wherein the continuous furnace includes a plurality of processing zones, and a temperature of the stacked body in a processing zone among the plurality of processing zones in which the stacked body is initially heated is within a range of not less than 150° C. and not more than 400° C.

6. The bonded object production method according to claim 1, wherein the stacked body includes:

a plurality of the metal members; and a plurality of the brazing material layers located respectively between the ceramic member and the plurality of metal members, the plurality of metal members each are metal plates, and the ceramic member is a ceramic substrate.

7. The bonded object production method according to claim 1, wherein the metal member is a copper plate.

8. The bonded object production method according to claim 1, wherein the brazing material layer does not include Ag, and the brazing material layer includes copper, titanium, and one or two selected from tin and indium.

9. The bonded object production method according to claim 1, wherein the ceramic member is a silicon nitride substrate.

10. A production method for a ceramic circuit substrate, the method comprising:

providing a circuit configuration in the bonded object obtained by the bonded object production method according to claim 1.

11. The production method for a ceramic circuit substrate according to claim 10, wherein the circuit configuration is provided by etching.

12. The bonded object production method according to claim 1, wherein the average temperature lowering rate is within a range of not less than 20° C./min and not more than 100° C./min, and an average conveyance speed of the stacked body is not less than 1 cm/min.

13. The bonded object production method according to claim 12, wherein the continuous furnace includes a plurality of processing zones, and a temperature of the stacked body in a processing zone among the plurality of processing zones in which the stacked body is initially heated is within a range of not less than 150° C. and not more than 400° C.

14. The bonded object production method according to claim 13, wherein the stacked body includes:

a plurality of the metal members; and a plurality of the brazing material layers located respectively between the ceramic member and the plurality of metal members, the plurality of metal members each are copper plates, the ceramic member is a silicon nitride substrate, the brazing material layer does not include Ag, and the brazing material layer includes copper, titanium, and one or two selected from tin and indium.

15. A production method for a ceramic circuit substrate, the method comprising:

providing a circuit configuration in the bonded object obtained by the bonded object production method according to claim 14.

16. The bonded object production method according to claim 12, wherein the stacked body includes:

a plurality of the metal members; and a plurality of the brazing material layers located respectively between the ceramic member and the plurality of metal members, the plurality of metal members each are copper plates, the ceramic member is a silicon nitride substrate, the brazing material layer does not include Ag, and the brazing material layer includes copper, titanium, and one or two selected from tin and indium.

17. A production method for a ceramic circuit substrate, the method comprising:

providing a circuit configuration in the bonded object obtained by the bonded object production method according to claim 16.

18. A bonded object production method using a continuous furnace to process a stacked body while conveying the stacked body, the stacked body including a metal member, a ceramic member, and a brazing material layer located between the metal member and the ceramic member, the method comprising:

heating the stacked body in an inert atmosphere from 200° C. to a bonding temperature at an average temperature raising rate of the stacked body of not less than 15° C./min;

bonding the stacked body in an inert atmosphere at the bonding temperature, the bonding temperature being within a range of not less than 600° C. and not more than 950° C.; and cooling the stacked body from the bonding temperature to 200° C. at an average temperature lowering rate of the stacked body of not less than 15° C./min, wherein an average conveyance speed of the stacked body is not less than 1 cm/min.

19. A bonded object production method using a continuous furnace to process a stacked body while conveying the stacked body, the stacked body including a metal member, a ceramic member, and a brazing material layer located between the metal member and the ceramic member, the method comprising:

heating the stacked body in an inert atmosphere from 200° C. to a bonding temperature at an average temperature raising rate of the stacked body of not less than 15° C./min;

bonding the stacked body in an inert atmosphere at the bonding temperature, the bonding temperature being within a range of not less than 600° C. and not more than 950° C.; and cooling the stacked body from the bonding temperature to 200° C. at an average temperature lowering rate of the stacked body of not less than 15° C./min, wherein the continuous furnace includes a plurality of processing zones, and a temperature of the stacked body in a processing zone among the plurality of processing zones in which the stacked body is initially heated is within a range of not less than 150° C. and not more than 400° C.

* * * * *